(12) United States Patent
Thiessen et al.

(10) Patent No.: US 6,297,657 B1
(45) Date of Patent: Oct. 2, 2001

(54) TEMPERATURE COMPENSATED VERTICAL PIN PROBING DEVICE

(75) Inventors: William F. Thiessen, Newtown; Francis T. McQuade, Watertown, both of CT (US)

(73) Assignee: Wentworth Laboratories, Inc., Brookfield, CT (US)

( * ) Notice: Subject to any disclaimer, the term of this patent is extended or adjusted under 35 U.S.C. 154(b) by 0 days.

(21) Appl. No.: 09/228,016

(22) Filed: Jan. 11, 1999

(51) Int. Cl.[7] .................................................. G01R 1/073
(52) U.S. Cl. ........................... 324/761; 324/758; 324/760
(58) Field of Search ................................... 324/761, 754, 324/755, 758, 158.1, 760

(56) References Cited

U.S. PATENT DOCUMENTS

| | | | |
|---|---|---|---|
| 4,027,935 | | 6/1977 | Byrnes et al. ........................ 339/48 |
| 5,323,105 | * | 6/1994 | Davis, Jr. et al. ................. 324/158.1 |
| 5,367,254 | * | 11/1994 | Faure et al. ......................... 324/761 |
| 5,442,299 | * | 8/1995 | Caggiano ............................ 324/758 |
| 5,488,314 | * | 1/1996 | Brandt et al. ....................... 324/758 |
| 5,670,889 | * | 9/1997 | Okubo et al. ....................... 324/760 |
| 5,854,558 | * | 12/1998 | Motooda et al. ................... 324/754 |
| 5,955,888 | * | 9/1999 | Frederickson et al. ............. 324/761 |
| 5,977,787 | * | 11/1999 | Das et al. ............................ 324/761 |
| 6,144,212 | * | 11/2000 | Mizuta ................................ 324/754 |
| 6,163,162 | * | 12/2000 | Thiessen et al. ................... 324/761 |

OTHER PUBLICATIONS

Sisco, Modern Metallurgy for Engineers, 2nd edition 1948; Pitman Publishing Corporation, pp. 298–299 in Chapter 16: High-Alloy Steels as Engineering Materials.
IBM, Probing Considerations in C-4 Testing of IC Wafers, The International Journal of Microcircuits and Electronic Packaging, vol. 15, No. 4, Fourth Quarter.
IBM, C-4 Product Design Manual, vol. 1: Chip and Wafer Design Chapter 9, Wafer Probing. Manual distributed to Sematech, MCNC at seminars in 1993 and 1994.

\* cited by examiner

*Primary Examiner*—Safet Metjahic
*Assistant Examiner*—Jimmy Nguyen
(74) *Attorney, Agent, or Firm*—William C. Crutcher

(57) ABSTRACT

An improved vertical pin probing device is constructed using Invar, which substantially matches the coefficient of thermal expansion of the silicon wafer being probed. Spaced dies with Invar foils supporting the probe pins are coated with wear-resistant dielectric materials having lubricity to permit the probe pins to slide in the holes during probing.

6 Claims, 3 Drawing Sheets

TEMPERATURE COMPENSATED VERTICAL PIN PROBING DEVICE

BACKGROUND OF THE INVENTION

Figure 1:
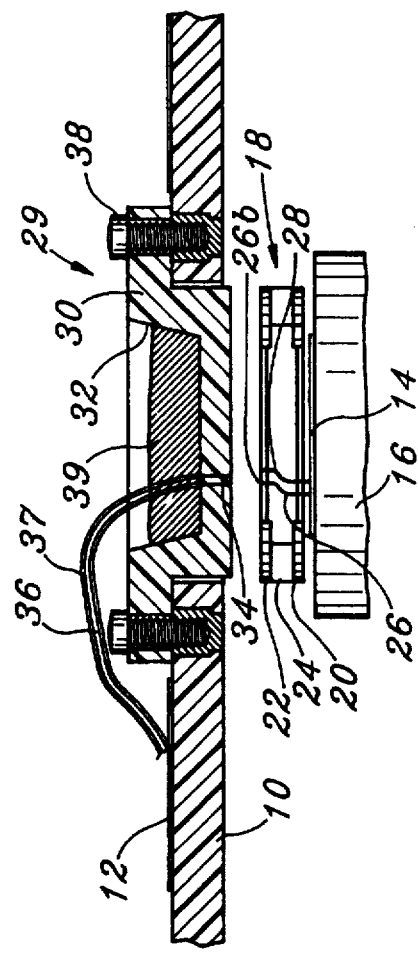

Integrated circuits in their wafer state are tested using probing devices, the probes of which are traditionally of cantilevered or vertical configuration. In a known type of vertical pin probing device, the probes are held between spaced upper and lower dies and are generally curved with a straight portion that protrudes substantially perpendicular to the lower die of the housing. As the wafer under test is raised into contact with the probing device, and then overdriven a few thousandths of an inch, the probes recede into the housing, and the curved portion of the probe deflects causing spring force that provides good electrical contact with the integrated circuit pads.

Traditionally, the housing is made from a dielectric material, often a plastic such as Delrin®, trademark of E.I. duPont de Nemours & Co.

When a certain IC (integrated circuit) is tested at two or more temperatures, over a large temperature range, for example 32 degrees F., room temperature, and 275 degrees F., the typical prior art probe housing expands with a significantly higher thermal expansion rate than that of the silicon base material of the IC wafer under test. Such expansion causes a mismatch of the probe locations and the IC pad locations, a condition that not only results in failure to make satisfactory electrical contact, but may result in fatal damage to the IC due to probe penetration in the circuit region of the IC.

One solution to this problem is to dimensionally compensate the room temperature pitch dimensions of probes in the housing so that at the specified test temperature it will have expanded to provide a nearly exact match of probe and pad positions. Except for temperatures within a narrow range, this option requires separate probe devices for each specific temperature, thus greatly increasing the user's monetary investment in probe devices.

Another solution would be to find a plastic or other suitable dielectric that matches the coefficient of thermal expansion of the silicon wafer. To date, however, the most practical choices of dielectric materials have expansion rates much higher than silicon.

One disadvantage of a plastic housing is that of electrical impedance characteristics. The tester and the probe device, which is generally mounted on a round printed circuit board, are designed to provide a certain characteristic impedance—usually 50 ohms. Such a design typically employs a ground plane or concentric metallic shield in relation to the conductor. The surface areas of the two conductors, the distance by which they are separated, and the dielectric constant of the dielectric material between the conductors determines the impedance. The plastic housing introduces a discontinuity in the desired characteristic impedance.

Another disadvantage of a plastic housing is that most plastics have a limited high temperature capability, preventing their use for vertical pin probing devices used to probe ICs at very high temperatures.

Accordingly, one object of the present invention is to provide a temperature compensated vertical pin probing device for probing integrated circuits over a large temperature range.

Another object of the invention is to provide an improved vertical pin probing device providing an improved electrical impedance match to the typical 50 ohm system impedance.

Still another object of the invention is to provide an improved vertical pin probing device suitable for probing integrated circuits at very high temperatures.

SUMMARY OF THE INVENTION

Briefly stated, the invention comprises an improved temperature compensated vertical pin probing device for probing integrated circuits over a large temperature range, the integrated circuits having spaced contact pads on a circuit substrate to be contacted by probe pins for testing, the probing device being of a known type comprising upper and lower spaced die members respectively defining upper and lower patterns of holes therethrough corresponding to the integrated circuit contact pad spacing at a preselected temperature, and a plurality of probe pins, each pin being disposed in a pair of upper and lower holes and extending beyond the lower die to terminate in a probe tip. The improvement comprises at least one of the die members having a die substrate with a coefficient of thermal expansion substantially the same as that of the circuit substrate, the die substrate having at least the inside of the holes in the die substrate coated with a layer of wear-resistant insulating material having a lubricity permitting sliding of the probe pins in the holes. In its preferred embodiment the die substrate is comprised of one or more thin foils of Invar metal alloy and the insulating coating is a dielectric coating of Parylene coated with an anti-stick material such as XYLAN®P-92DF. Parylene is the generic name for poly-para-xylylene or DPXN which offers high dielectric strength and may be deposited in the vapor phase for conformal coating on all sides to form a pinhole free-continuous insulating coating.

DRAWING

Figure 2:
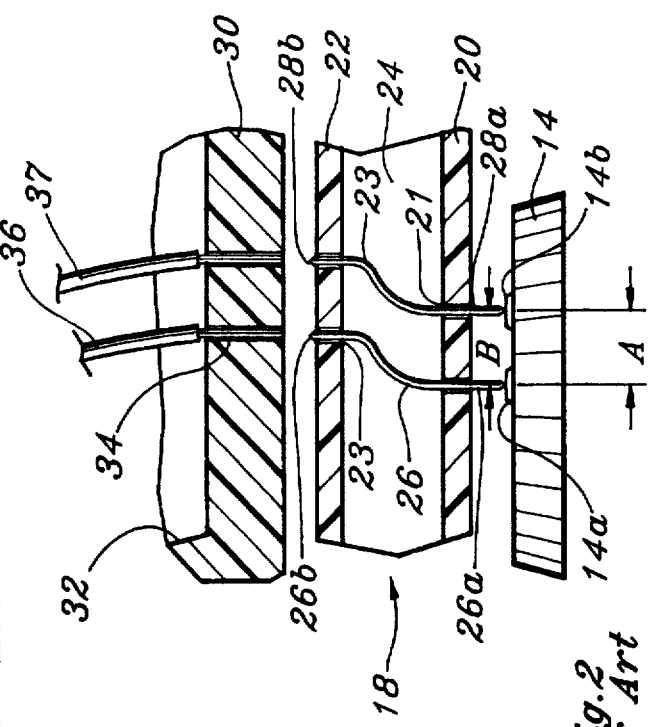
Figure 4:
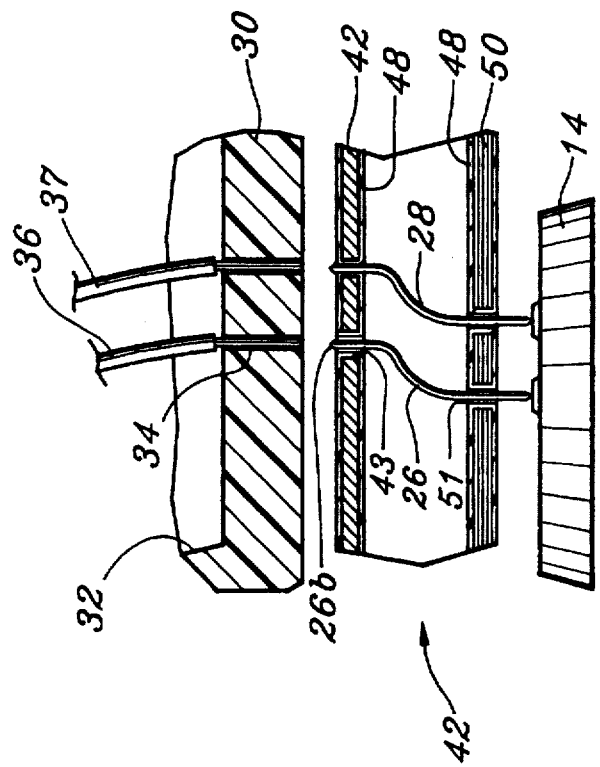
Figure 6:
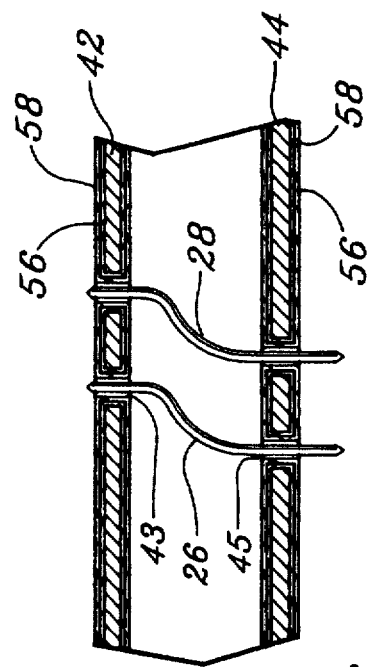
Figure 3:
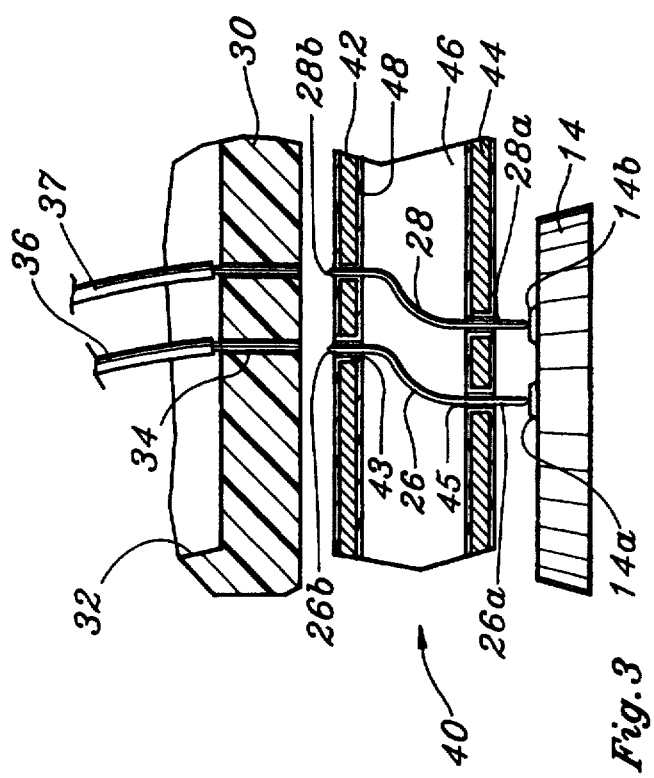
Figure 5:
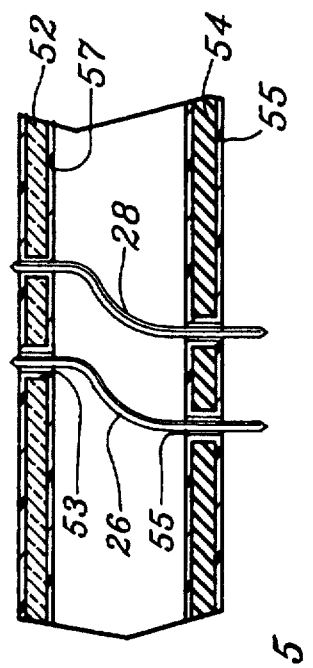
Figure 7:
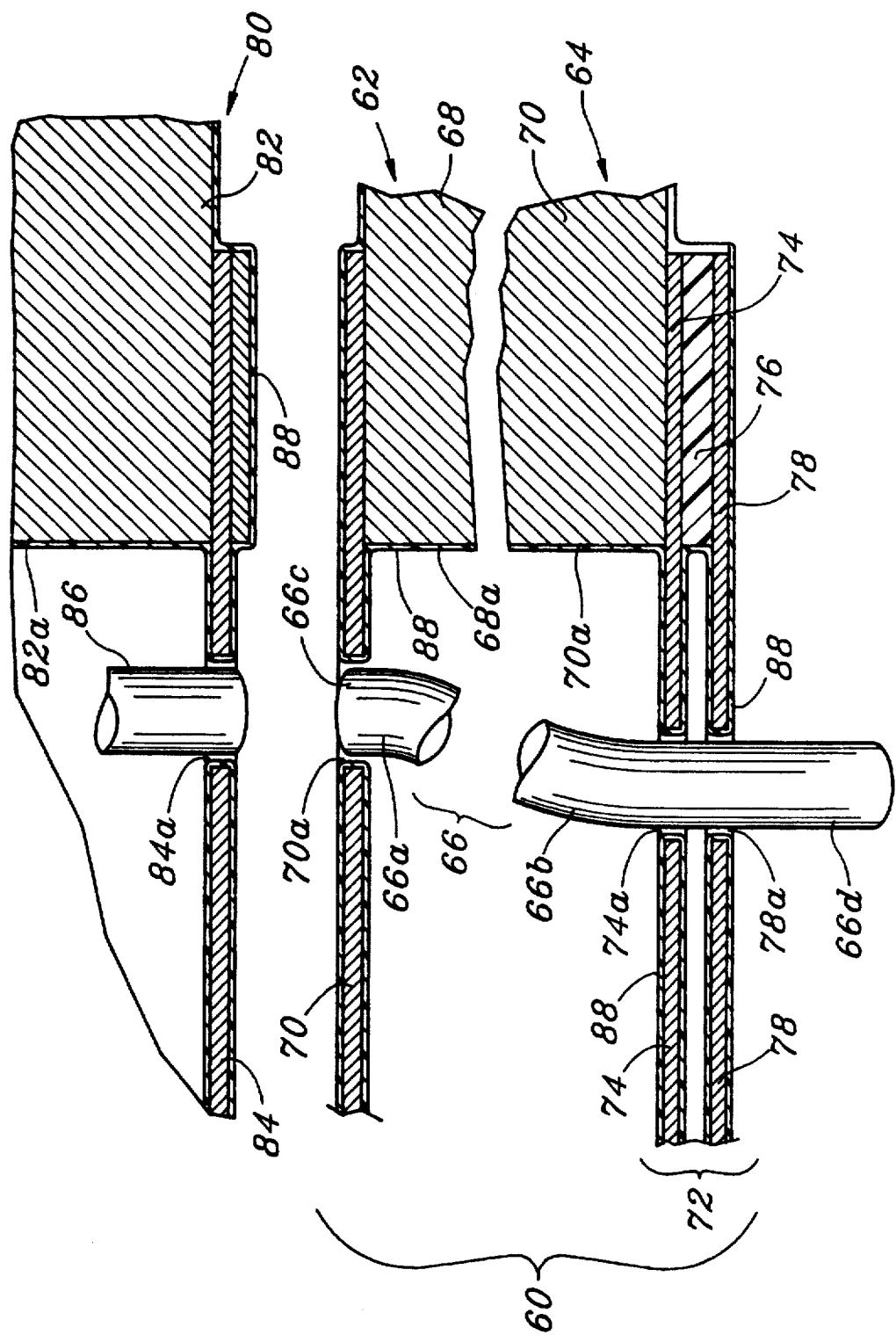

The subject matter, which is regarded as the invention, is particularly pointed out and distinctly claimed in the concluding portion of the specification. The invention, however, both as to organization and method of practice, together with further objects and advantages thereof, may best be understood by reference to the following description, taken in connection with the accompanying drawings, in which:

FIG. 1 is an elevational drawing in cross section showing a prior art vertical pin probing device, together with portions of a printed circuit test board and wired interface and portions of a silicon wafer and chuck support, FIG. 2 is an enlarged side elevational view in cross section showing details of the vertical pin probing device construction for two probe pins, FIG. 3 is an enlarged side elevational view in cross section similar to FIG. 2, illustrating one modification of the present invention, FIG. 4 is an enlarged side elevational view in cross section similar to FIG. 2, illustrating another modification of the invention, FIG. 5 is an enlarged side elevational view in cross section similar to FIG. 2, illustrating still another modification of the invention, FIG. 6 is an enlarged side elevational view in cross section similar to FIG. 2, illustrating yet another modification of the invention, and FIG. 7 is a greatly enlarged partial side elevational view in cross section illustrating a preferred embodiment using metal foils.

DETAILED DESCRIPTION OF THE DRAWINGS

Before describing the improvements of the present invention, reference should be made to FIGS. 1 and 2 of the drawing illustrating a prior art vertical pin probing device used with an interconnecting device called a "space transformer" and a printed circuit board. The simplified view of FIG. 1 illustrates a prior art construction. A printed circuit test board 10 sometimes called a "probe card" includes conductive traces 12 which are connected in test circuit relationship to integrated circuit test equipment (not shown). In practice, the traces 12 lead to "pogo pads" on the printed circuit board, to which the external test equipment leads are connected in a prescribed test. An integrated circuit 14 or other device under test is supported on a movable chuck 16. Integrated circuit 14 typically has a pattern or matrix of contact pads to be simultaneously probed by a vertical-pin integrated circuit probing device 18, such as the COBRA® probe head sold by Wentworth Laboratories. Probing device 18 includes a lower die 20 with a group of holes 21 and upper die 22 with a group of holes 23 separated by a spacer 24 and carrying multiple vertical pin probes 26, 28. The die materials are typically made of a plastic insulating material such as Delrin®, an acetal resin manufactured by E.I. duPont de Nemours & Co.

Reference to the enlarged cross-section view FIG. 2 illustrates that the two representative probes 26, 28 include probe tips 26a, 28a respectively protruding from holes 21 in the lower face of lower die 20 and exposed heads 26b, 28b respectively protruding from holes 23 in the upper side of upper die 22. The holes 21, 23 containing the opposite ends of the vertical probe pins 26, 28 are slightly offset from one another and the probe pins are curved in a snake-like configuration to promote buckling, so as to create substantially uniform contact pressure on the integrated circuit pads 14a, 14b despite any slight vertical unevenness or misalignment.

A prior art space transformer shown in FIG. 1 is indicated generally at 29 and comprises a mounting block 30 with a well 32 formed therein. At the bottom of the well, a number of holes 34 are laid out to dimensionally correspond to a first small inner pattern defined by the exposed heads 26b of the probe head assembly 18. The probing assembly 18 is shown separated from the space transformer 29 for clarity but is connected thereto in actual operation by screws (not shown).

An individual insulated wire 36 is connected to PCB trace 12 at one end and on the other end, the wire extends into a hole 34 in the mounting block 30 so as to be in electrical contact with probe head 26b on the underside of block 30 when the probe assembly 18 is bolted to the space transformer 29. A similar wire 37 cooperates with probe head 28b.

Space transformer 29 is attached to the PC board by means such as screws 38, and an epoxy potting compound 39 immobilizes wires 36, 37. The probing device 18 is attached to the underside of space transformer 29 by screws (not shown), so that probe heads 26b, 28b make electrical contact with leads 36, 37. The integrated circuit 14 has a number of spaced contact pads, such as 14a, 14b, spaced apart by dimension A. The probe tips 26a, 26b are spaced apart by dimension B. Prior art devices in which the coefficient of thermal expansion of the die material is substantially different from the coefficient of thermal expansion of the silicon wafer (0.00000156 inches per inch per degree F. (or in metric equivalents 0.0000028 meters per meter per degree Kelvin) will result in a mismatch between dimensions A and B to a degree which depends on the temperature range of probing.

Referring now to FIG. 3 of the drawing, the same mounting block 30 for the space transformer and the same integrated circuit 14 are shown as before, but with an improved vertical pin probing device according to the present invention, shown generally as 40. Probing device 40 comprises an upper die member 42 with a pattern of holes 43 and a lower die member 44 with a pattern of holes 45. The die members 42, 44 are separated by spacers 46, and arranged to hold probing pins 26, 28 constructed as previously described. Upper and lower die members 42, 44 are fabricated from a substrate core material having a coefficient of thermal expansion as close as possible to that of the silicon making up the circuit substrate. One such preferred material is a nickel metal alloy of INVAR®, (registered trademark of Imphy S.A.) having a coefficient of thermal expansion of 0.00000100 inches per inch per degree F. (0.0000018 meters per meter per degree Kelvin) at a nominal composition of 36% nickel. The coefficient of thermal expansion may be adjusted by varying the percentage of nickel in the alloy to even more closely match that of silicon, if desired.

Because Invar is an electrical conductor, the probes are insulated from the Invar housing with a dielectric coating 48. The coating 48 is applied so as to also coat the insides of the holes 43, 45 in which the probe pins 26, 28 are disposed. It is not necessary to coat the entire die substrate, as long as at least the insides of holes 43, 45 are coated. The selected coating 48 in this case is Parylene, covered with an anti-stick agent. Parylene is the generic name for poly-para-xylylene or DPXN which offers high dielectric strength and may be deposited in the vapor phase for conformal coating on all sides to form a pinhole free-continuous insulating coating. A suitable anti-stick agent is XYLAN®, manufactured by Whitford Corporation, which is a fluorocarbon or fluoropolymer based coating material suitable for coating metals and having low friction and wear-resistant properties. Xylan P-92DF is a suitable composition with a continuous operating temperature of 260 degrees C. Other anti-stick films available from duPont and Acheson are also useful. It is important to select a film having lubricity to allow sliding of the probe pins in the lower die holes, as well as a film having good dielectric insulating capability and wear resistance.

A variation of the invention is seen in FIG. 4. There, the upper die includes a core substrate member 42 of Invar with holes 43 and coated with a dielectric insulating film 48 as previously described. The lower die member 50 is composed of metal foils of Invar which are stacked in a laminated structure having a pattern of aligned holes 51 and coated with the previously described insulating and anti-stick coating 48. The laminations or foils are held together by adhesive and the holes are drilled using a laser or other suitable means. Either the upper or lower metal die or both may be constructed of Invar laminations or foils as desired.

Referring to FIG. 5 of the drawing, the construction is as previously noted, except that the core members of the upper and lower dies, shown by reference numbers 52, 54 with groups of holes 53, 55 respectively are selected from a ceramic material known as MACOR®, manufactured by Corning Glass Works and having a coefficient of thermal expansion of 0.0000052 inches per inch degree F. (0.0000093 meters per meter per degree Kelvin). The Macor cores 52, 54 are coated with an anti-stick coating 57 of the type previously described, such as Xylan. Since the ceramic is an insulator, no dielectric coating is needed. While the coefficient of thermal expansion is not as close to that of silicon as the Invar, it is close enough for all practical purposes, as compared to that of the previously used Delrin plastic material having a coefficient of thermal expansion of 0.000047 inches per inch per degree F., or 0.000084 meters per meter per degree Kelvin.

FIG. 6 illustrates another variation of the invention having two coatings applied to the Invar upper and lower die substrates 42, 44 with patterns of holes 43, 45 respectively previously described. An inner insulating coating of aluminum oxide or other suitable dielectric material such as tantalum oxide, or silicon dioxide is shown at 56 providing insulation for the conductive core. While aluminum oxide is a good insulating material, it does not provide the proper lubricity for allowing the probe pins to slide. Therefore an additional coating of anti-stick film indicated by reference number 58 is applied on the outside of the aluminum oxide coating.

Referring now to FIG. 7 of the drawing, portions of a modified probing device 60 are shown in greatly enlarged form, comprising an upper die member 62 and a lower die member 64 supporting a group of probe pins between them. Only one such probe pin is shown, and of this, only the upper probe pin end 66a and the lower probe pin end 66b. The head of the probe pin 66c extends above the top of die member 62 and the probe tip 66d extends below the lower surface of die member 64. The upper die member 62 comprises a metallic spacer member 68 which may be a single annular member or constructed in sections. Similarly the lower die member 64 includes a similar spacer 70, which is adapted to be attached to spacer 68 by bolts (not shown). The spacer member 68, 70 define respective central holes 68a, 70a. Hole 68a and the upper die member is covered by a die substrate 70 defining a pattern of holes, one of which is shown at 70a. Substrate 70 is comprised of a material having a coefficient of thermal expansion substantially that of silicon. Preferably the substrate 70 is a metal foil of Invar having a thickness between 3 and 10 mils. Holes 70a are drilled by a laser beam using a process well known in the art.

The hole 70a in the lower spacer member 70 is covered by a substrate 72 comprising a pair of spaced foils of Invar as described above. One of the foils designated as 74 is attached to the spacer block 70 by means of an adhesive. A spacer member 76 is adhered to the foils 74 and a second foil 78 is adhered to the spacer 76. A pair of aligned holes 74a, 78a are drilled by laser in each of the foils 74, 78. The center line of holes 74a, 78a is offset from the center lines of holes 70a to accommodate the curvature of the probe pin 66.

Portions of a modified space transformer 80 are shown above the probe device 60. Space transformer 80 comprises a spacer block 82 defining a central opening 82a, which is covered by a metallic foil 84 with a pattern of holes such as 84a drilled therein. The pattern of holes 84a corresponds with the pattern of holes 70a. Portions of a conductive wire 86 are shown which terminate in the respective holes 84a. The wires 86 are connected to the circuit board in a manner previously described and may be afixed in a potting compound to hold them in place.

It remains to note that the probing device 60 is actually adapted for attachment to the underside of the space transformer 80 so that the probe heads 66c contact the ends of the wires 86. Before the assemblies are connected, however, the space transformer 80 and the upper and lower die members 62 are coated according to the present invention with an insulating coating and an anti-stick coating, which is indicated generally on all of the members by reference numeral 88 noted throughout the drawing. The insulating portion of the coating is preferably Parylene which is applied by vapor deposition and provides a continuous coating free of pin holes over the entire exposed surface of the members, including the insides of holes 70a, 74a, 78a and 84a. On top of this is applied the anti-stick coating of Xylan. After application of the wear-resistant coating providing good lubricity, designated by reference numeral 88, the die members 62, 64 are attached together, along with probe pins 66, and the assembled probe 60 is then attached to the space transformer 80, whereupon probing takes place in the usual manner. Since the Invar foils have thermal coefficients of expansion substantially equal to that of silicon, spacing between probe tips is maintained over wide temperature range.

Other materials may also be suitable for the upper and lower dies of the vertical pin probing device which have a coefficient of thermal expansion substantially the same as that of the wafer material. The invention does not preclude the use of silicon wafer material itself for the dies of the vertical pin probing device, although there are some difficulties associated with drilling the hole pattern. Since the critical spacing match between probe pins and contact pads on the integrated circuit are on the lower die, it is possible that only the lower die need be constructed as described. However it is preferable that both upper and lower die be similarly constructed.

While there has been described what is considered to be the preferred embodiment of the invention and several modifications thereof, other modifications will occur to those skilled in the art, and it is desired to secure in the appended claims all such modifications as fall within the true spirit and scope of the invention.

What is claimed is:

1. An improved temperature compensated vertical pin probing device for probing integrated circuits over a large temperature range, the integrated circuits having spaced contact pads on a circuit substrate to be contacted by probe pins for testing, the probing device being of a known type comprising upper and lower spaced die members respectively defining upper and lower patterns of holes therethrough corresponding to the integrated circuit contact pad spacing at a preselected temperature, and a plurality of probe pins, each pin being slidably disposed in a pair of upper and lower holes and extending from a said lower hole in the lower die to terminate in a probe tip, the improvement comprising:

a die member having a die substrate with a coefficient of thermal expansion substantially the same as that of the circuit substrate, the die substrate comprising a laminated structure of thin metal alloy foils of Invar having at least the inside of the holes in the die substrate coated with a layer of wear-resistant insulating material having a lubricity facilitating sliding of the probe pins in the holes.

2. The improvement according to claim 1, wherein the insulating coating is selected from a group consisting of Parylene, aluminum oxide, tantalum oxide and silicon dioxide.

3. The improvement according to claim 1, wherein the lubricity is provided by an anti-stick coating of Xylan.

4. The improvement according to claim 1, wherein both upper and lower die members comprise said die substrate.

5. The improvement according to claim 1, wherein said insulating coating comprises a layer of Parylene with an anti-stick coating of Xylan surrounding said laminated structure.

6. An improved temperature compensated vertical pin probing device for probing integrated circuits over a large temperature range, the integrated circuits having spaced contact pads on a circuit substrate to be contacted by probe pins for testing, the probing device being of a known type comprising upper and lower spaced die members respectively defining upper and lower patterns of holes therethrough corresponding to the integrated circuit contact pad spacing at a preselected temperature, and a plurality of probe pins, each pin being slidably disposed in a pair of upper and lower holes and extending from a said lower hole in the lower die to terminate in a probe tip, the improvement comprising:

at least one of said die members having an outer spacer block defining a central opening and adapted for attachment to the other die member and a die substrate comprising at least one laminated structure comprising a plurality of thin metal alloy foils of Invar attached to the spacer block and bridging the central opening, said foil laminated structure defining one of said patterns of holes, the foil laminated structure having a coefficient of thermal expansion substantially the same as that of the circuit substrate, said die substrate being coated with a layer of wear-resistant insulating material and a layer of anti-stick material having a lubricity facilitating sliding of the probe pins in the holes.

* * * * *